United States Patent [19]

Dumesnil et al.

[11] Patent Number: 4,997,718
[45] Date of Patent: Mar. 5, 1991

[54] SILVER PHOSPHATE GLASS DIE-ATTACH COMPOSITION

[75] Inventors: Maurice E. Dumesnil, Los Altos Hills; Leo Finkelstein, San Francisco, both of Calif.

[73] Assignee: VLSI Packaging Materials, Inc., Sunnyvale, Calif.

[21] Appl. No.: 433,539

[22] Filed: Nov. 8, 1989

[51] Int. Cl.$^5$ ............................ C03C 8/14; C03C 3/16
[52] U.S. Cl. ........................................ 428/426; 501/17; 501/45; 106/1.23; 428/432; 428/433; 428/434
[58] Field of Search ....................... 501/15, 17, 41, 44, 501/45, 46, 32, 73; 428/426, 432, 433; 106/1.23

[56] References Cited

U.S. PATENT DOCUMENTS

| | | | |
|---|---|---|---|
| 3,408,212 | 10/1968 | Dumesnil | 501/44 |
| 3,518,209 | 6/1970 | Provance | 501/46 |
| 3,755,065 | 8/1973 | Chvatal | 501/15 |
| 3,798,114 | 3/1974 | Chvatal | 501/47 |
| 3,853,568 | 12/1974 | Chvatal | 501/41 |
| 3,885,975 | 5/1975 | Malmendier | 501/41 |
| 3,930,093 | 12/1975 | Short | 501/15 |
| 4,039,721 | 8/1977 | Weitze et al. | 428/426 |
| 4,226,628 | 10/1980 | Bartholomew | 501/45 |
| 4,743,302 | 5/1988 | Dumesnil et al. | 501/46 |

FOREIGN PATENT DOCUMENTS

| | | | |
|---|---|---|---|
| 0022425 | 7/1970 | Japan | 501/44 |
| 1433854 | 4/1976 | United Kingdom | 501/45 |

Primary Examiner—William R. Dixon, Jr.
Assistant Examiner—Paul Marcantoni
Attorney, Agent, or Firm—Irell & Manella

[57] ABSTRACT

Extremely low-melting oxide glasses useful in silver-/glass die-attach materials are disclosed. These glasses are composed of silver oxide, phosphorus oxide and a third component comprising PbO, CdO, ZnO or combination thereof. Their melting point lies in the 200°–300° C. range.

23 Claims, No Drawings

SILVER PHOSPHATE GLASS DIE-ATTACH COMPOSITION

TECHNICAL FIELD

The present invention relates to a novel, very low-melting metal oxide glass system derived from the silver phosphate binary and a method of manufacturing same.

It is particularly concerned with the application of this novel glass as an inorganic binder for silver metal powder to bond (die attach) semiconductor integrated devices on a ceramic substrate.

BACKGROUND

The invention addresses the problem of bonding to a ceramic package surface certain types of temperature-sensitive semiconductor devices at the lowest possible temperature with a silver/glass mixture usually in the form of a dotting paste.

In addition to the well-known gold/silicon eutectic alloy die-bonding process, the advent of glass/silver is a solution to the eutectic bond stress problems associated with very large silicon die. Silver-loaded glass die-attach materials have demonstrated production reliability on die exceeding 0.4 inch on a side and can be used on both bare silicon and gold-covered silicon. During firing the glass flows to the device and forms a conventional chemical bond, the glass and silver interpenetrate and form a mechanical bond. After completion of the thermal treatment, the microstructure consists of an interlaced network of silver in a sintered glass matrix. The malleability of silver permits greater stress relief in the bond compared with gold eutectic preforms. The process has a wide processing window, and the glass die bonding material offers a significant cost advantage over the Au-Si system.

One major drawback remains the processing temperature which lies in the 400°–500° C. range in an oxidizing atmosphere for several minutes. This tends to create reliability problems to both multi-pin ceramic packages and temperature-sensitive VLSI devices. Lead borate-based glasses do not allow a processing temperature below 400° C. Reduction of the glass processing temperature to about 300–350° C. by a glass formulation change would aid in coping with the processing reliability problems associated with multi-pin ceramic packages and the new generation of silicon integrated devices.

This glass formulation must be totally free of any alkali or halide.

PRIOR ART

In the prior art relatively small amounts of silver oxide have been incorporated in glasses. Examples are radiation-sensitive glasses manufactured for gamma and neutron dosimeters (Bromer in U.S. Pat. No. 3,607,321; Yokota in U.S. Pat. No. 3,740,241).

The extensive role of silver oxide in certain low-melting glasses in large concentrations has been described by Chvatal in U.S. Pat. Nos. 3,798,114 and 3,853,568. These compositions comprise 20–70 weight percent silver oxide, the balance a combination of other oxides to produce a series of low-melting, chemically resistant, high-expansion glasses. These patents do not describe the addition of lead oxide, cadmium oxide, zinc oxide, any of which is a necessary and required component in glasses of the present invention. Nor do these patents mention $Nb_2O_5$, $Ta_2O_5$, $Al_2O_3$, $Cu_2O$, which are desirable additives. Further, there is no teaching of silver metal/silver oxide glass mixtures.

Binary silver phosphate glasses can be made with 40–60 mole percent $Ag_2O$. These are very fluid glasses, but tend to be hygroscopic in fine powder form. Takahashi K., *Advances in Glass Technology*, 6th Congress on Glass, N.Y., 1962, Part 1, p. 366, measured their thermal expansion coefficient to be in the range of $175-200 \times 10^{-7}/°$ C. According to Bartholomew, R. F., *J. Noncrystalline Solids* (1972) 7.3, 221, the 50 mole percent $Ag_2O$ phosphate glass has an annealing point of 154° C.

Provance in U.S. Pat. No. 3,518,209 claims semiconducting glasses containing $MoO_3$ (20–68 mole %), $P_2O_5$ (20–57 mole %), and $Ag_2O$, $CuO$ or $V_2O_5$ (30–40 mole %).

Disclosure of the Invention

The present invention is based on the discovery that very fluid, chemically resistant and stable glasses can be prepared by the addition of lead oxide, cadmium oxide and/or zinc oxide to the $Ag_2O$—$P_2O_5$ binary.

The novel low-melting glass composition of this invention comprises in weight percent calculated on an oxide basis:

| (a) | $Ag_2O$ | 40–70% |
|---|---|---|
| (b) | $P_2O_5$ | 20–40% |
| (c) | PbO, CdO, ZnO or combination thereof | 0.1–25% |
| (d) | $Bi_2O_3$ | 0–20% |
| (e) | $Nb_2O_5$ | 0–5% |
| (f) | $Ta_2O_5$ | 0–5% |
| (g) | $Cu_2O$ | 0–5% |

These glasses have a softening point in the 200–300° C. range, are stable in powder form even when blended with the organic solvents and resins commonly used for printing ceramic powders, and are eminently compatible with noble metals.

Preferred glass compositions of this invention consist essentially, in weight percent calculated on an oxide basis, of:

| (a) | $Ag_2O$ | 50–60% |
|---|---|---|
| (b) | $P_2O_5$ | 25–35% |
| (c) | PbO, CdO, ZnO, or combination thereof | 0.2–20% |
| (d) | $Bi_2O_3$ | 0–15% |
| (e) | $Nb_2O_5$ | 0–3% |
| (f) | $Al_2O_3$ | 0–3% |

Mixtures of the above-described glass composition with up to 90% by weight based on the total mixture of silver and gold powder are another aspect of the invention.

Mixtures of the above-described novel glass composition with or without silver or gold powder combined with an organic liquid to form a dotting paste or a printing ink are yet another aspect of the invention.

Mixtures of the above-described novel glass composition with about 1% to about 50% by weight, based on the mixture, of a low thermal expansion ceramic particulate filler are yet another aspect of the invention.

DETAILED DESCRIPTION OF THE INVENTION

The glasses of this invention contain primarily $Ag_2O$ (silver oxide), a metal oxide which acts in these glasses like an alkali oxide, thus providing very low softening temperatures without the disadvantage of alkalies in glass since $Ag_2O$ is water insoluble.

The addition of $P_2O_5$ (phosphorus oxide) to $Ag_2O$ produces extremely low-melting glasses which in fine powder form are unstable and hygroscopic. The addition of one or more heavy metal oxide such as lead, cadmium and zinc to the $Ag_2O$—$P_2O_5$ binary has the effect of stabilizing the resulting glass and enhancing its good durability.

The glasses of this invention are very stable and show no tendency to recrystallize. They are characterized by low softening temperatures, low viscosities and steep viscosity curves with increasing temperature. They are unaffected by organic liquids, and they exhibit excellent wetting and bonding to both alumina (due to the amount of $P_2O_5$ present) and metals such as silver and gold (due to the presence of large amounts of silver oxide in the glass formulation).

The prime objective of this invention is using these novel silver-glass compositions for attaching a semiconductor device to a metal, glass or ceramic surface. We have found that although the linear thermal expansion of the heavy metal-silver phosphate glasses of this invention are high and equivalent to silver metal, very good bonding of these glass/silver mixtures is obtained to alumina, gold-plated alumina and certain types of copper lead frames (copper alloy containing small percentages of Al and Si). This is apparently due to the interlaced silver-glass microstructure of the bond.

Since the semiconductor technology evolves toward larger silicon die sizes, larger ceramic package geometries and the change in lead frame material in plastic packages from alloy 42 (Kovar) to copper, it requires more stress-absorbing die-attach materials to accommodate the thermal expansion mismatches between different materials within a package.

The silver/glass die-attach compositions of this invention are intimate mixtures of powdered silver metal and powdered glass. The metal powder will normally constitute 50 to 90% by weight of the mixture. The powdered silver may be spherical or flake powder or mixtures of the two, preferably having surface areas from about 0.3 to 1.3 square meters per gram and tap densities from about 2.4 to 3.4 gram per cubic centimeter.

Suitable organic vehicles comprise a viscosified synthetic solvent such as high molecular weight alcohols, esters and glycol ethers viscosified with nitrocellulose, ethyl cellulose or a methacrylate resin (ethyl or isobutyl methacrylate) as described in our previous U.S. Pat. No. 4,699,888.

Particulate refractory filler may be added to the glass powder of the invention as a means of controlling the overall thermal expansion and contraction of the resulting sealing glass mixture. Increased amounts of a low thermal expansion refractory filler will correspondingly decrease the linear expansion of the sealing glass, the decrease being practically a linear function of the glass/filler volume ratio. Such fillers are commonly used to make solder glass suitable for sealing to lower expansion ceramics, glasses or metals. Close matching of thermal expansion of the sealing glass to the ceramic parts (e.g. alumina, berylia or steatite parts) to be joined is critical to maintain zero stress in the seal joint. This insures strength and hermeticity under extreme conditions of thermal cycling and thermal shock. It is also known that the presence in a glass of a crystalline second phase is beneficial in strengthening a glass seal. The addition of a particulate filler will minimize crack propagation throughout the glass.

These refractory, low coefficient of thermal expansion (below about $50 \times 10^{-7}/°$ C.) fillers include the conventional low expansion crystalline ceramic materials found useful in the technology of lead solder glasses: beta eucryptite, spodumene, cordierite, zirconium silicate, zinc silicate (willemite) and titanates such as lead titanate and lead calcium titanate. It also includes refractory fillers made from Column 5 metal oxides in the periodic table (P, As, Sb, V, Nb and Ta) as listed in Table 1 of U.S. patent No. 4,743,302. It thus includes, as examples, refractory zirconium phosphate, titanium phosphate, calcium titanium phosphate, niobium phosphate, tin phosphate, niobium pentoxide, and its derivatives such as aluminum niobate, niobium titanate and niobium zirconate.

A further feature of the present invention, due to the thermal instability of silver oxide above 300° sides in the introduction of silver oxide in the batch formulation in the form of $Ag_3PO_4$, a stable compound, as a starting material. The melting aid is provided with ammonium phosphate. The other components are added in the form of nitrates: lead nitrate, cadmium nitrate, zinc nitrate, bismuth nitrate, alumina nitrate and copper nitrate, or in the form of a hydrate: niobium oxide hydrate. Ceramic crucibles are preferred. A heating cycle of 45 minutes at 700° C. for 100 gram batches produces a clear melt.

The following examples describe the preparation and composition of the sealing glasses of the invention and their applications. These examples are not intended to limit the invention in any manner.

EXAMPLE 1

A glass was prepared by mixing 20 grams $Ag_3PO_4$, 10 grams ammonium dihydrogen phosphate and 10 grams lead nitrate. After heating the mixture in a ceramic crucible at 700° C. for 45 minutes the melt was poured through revolving stainless steel rollers to produce thin glass flakes. The resulting glass flakes had a composition in weight per cent as follows:

| | |
|---|---|
| $Ag_2O$ | 50.5% |
| $P_2O_5$ | 29.1% |
| PbO | 20.4% |

This glass has a linear thermal expansion coefficient (25-50° C.)=$190 \times 10^{-7}/°$ C. and a DTA softening point=210° C. This glass bonds to alumina at 250° C.

The glass flakes were ground in a ball mill and the resulting powder screened through a 325 mesh screen. Near its melting point this glass powder exhibits a very sharp drop in viscosity, wets and adheres to an alumina surface with great tenacity.

Mixtures of silver metal powder flakes and the above fine glass powder were prepared in ratios of 20 to 50% by weight glass, mixed with Texanol solvent and wet dotted on an alumina substrate. Silicon chips were imbedded in the paste, dried at 125° C. then heated in a belt furnace to 350° C. in air. Extremely strong bonding of the silicon die to the silver/glass matrix to alumina was obtained.

This example was repeated using gold powder with identical results. Both silver and gold compositions were printed on glass and ceramic substrate, dried, fired to produce a conductive pattern with excellent adherence at a very low firing temperature.

Additional examples of low melting glasses of the invention were prepared following the procedure described in the above example. These additional examples 2 to 16 are reported in Table 1 below.

TABLE 1

| Component | Examples 2-16 in Weight Percent | | | | | | | | | | | | | | |
|---|---|---|---|---|---|---|---|---|---|---|---|---|---|---|---|
| | 2 | 3 | 4 | 5 | 6 | 7 | 8 | 9 | 10 | 11 | 12 | 13 | 14 | 15 | 16 |
| PbO | | | | | 10 | 10 | | 10 | | | 10 | 10 | 10 | 10 | 5 |
| CdO | 10 | 20 | | | | | | | 10 | | | | | | 5 |
| ZnO | | | 10 | 20 | 5 | 5 | | | | 10 | | | | | 5 |
| $Bi_2O_3$ | | | | | 6 | 12 | 18 | 6 | 6 | 6 | | | | | 5 |
| $Al_2O_3$ | | | | | | | | | | | 3 | | | | |
| $Nb_2O_5$ | | | | | | | | | | | | 3 | | | |
| $Ta_2O_5$ | | | | | | | | | | | | | 3 | | |
| $Cu_2O$ | | | | | | | | | | | | | | 3 | |
| $Ag_2O$ | 60 | 50 | 60 | 50 | 50 | 45 | 52 | 52 | 52 | 55 | 65 | 65 | 65 | 65 | 50 |
| $P_2O_5$ | 30 | 30 | 30 | 30 | 29 | 28 | 30 | 32 | 32 | 30 | 22 | 22 | 22 | 22 | 30 |
| Softening Point °C. | 210 | 225 | 210 | 230 | 220 | 238 | 210 | 215 | 218 | 223 | 210 | 213 | 224 | 235 | 218 |

EXAMPLE 17

Each glass Example 2 to 16 was mixed in powdered form with 80% by weight silver powder and tested according to Example 1. Excellent bonding of the silicon die was obtained in all cases. Optimum processing temperature had to be adjusted as a function of glass modifiers content added to the silver phosphate binary. The higher the glass modifiers content, the higher the temperature required to reach maximum strength.

EXAMPLE 18

The procedures of Examples 1 to 16 were repeated using a copper alloy substrate (copper containing a few per cent Si and Al and covered with a thin adherent oxide layer) with identically good adherence between the silver/glass material and the copper alloy surface.

EXAMPLE 19

Preforms of silver/glass mixtures were prepared by mixing the glass powder from Example 1 with 50 per cent by weight silver powder. The mix was heated at elevated temperatures in a ceramic crucible and poured through cold stainless steel rollers to produce ten mil thick flakes which can be remelted at low temperature for electrically conductive bonding applications.

EXAMPLE 20

Powdered glass composition Example 12 was blended with 20, 30 and 40 per cent by weight based on the total mixture with low expansion fillers such as zirconium phosphate to produce lower thermal expansion sealing glass mixtures.

Modifications of the above-described modes for carrying out the invention that are obvious to those of skill in the glassmaking, semiconductor packaging, and related arts are intended to be within the scope of the following claims.

We claim:

1. A low-melting glass composition consisting essentially of, in weight per cent calculated on an oxide basis:

| (a) $Ag_2O$: | 40 to 70% |
|---|---|
| (b) $P_2O_5$: | 20 to 40% |
| (c) PbO: | 0.1 to 25% |
| (d) $Bi_2O_3$: | 0 to 20% |
| (e) $Nb_2O_5$: | 0 to 5% |

| (f) $Ta_2O_5$: | 0 to 5% |
|---|---|
| (g) $Al_2O_3$: | 0 to 5% |
| (h) $Cu_2O$: | 0 to 5%. |

2. The low-melting glass composition of claim 1 wherein the weight per cent of each of (d), (e), (f), (g) and (h) is 0%.

3. A low-melting glass composition consisting essentially of in weight per cent calculated on an oxide basis;

| (a) | $Ag_2O$ | 50 to 60% |
|---|---|---|
| (b) | $P_2O_5$ | 25 to 35% |
| (c) | PbO | 5 to 20% |
| (d) | $Bi_2O_3$ | 0 to 10% |
| (e) | $Al_2O_3$: | 0 to 3% |
| (f) | $Nb_2O_3$: | 0 to 3%. |

4. The glass of claim 1 mixed with about 1 to 50% by weight, based on the mixture, of a refractory filler powder with a low coefficient of linear expansion.

5. The glass of claim 2 mixed with about 1 to by weight, based on the mixture, of a refractory filler powder with a low coefficient of linear expansion.

6. The glass of claim 3 mixed with about 1 to by weight, based on the mixture, of a refractory filler powder with a low coefficient of linear expansion.

7. The glass of claim 1 mixed with up to 90% by weight, based on the mixture, of silver or gold powder.

8. The glass of claim 2 mixed with up to 90% by weight, based on the mixture, of silver or gold powder.

9. The glass of claim 3 mixed with up to 90% by weight, based on the mixture, of silver or gold powder.

10. A composition comprising a glass consisting essentially of:

| (a) | $Ag_2O$ | 40 to 70% |
|---|---|---|
| (b) | $P_2O_5$ | 20 to 40% |
| (c) | $Bi_2O_3$ | 0.1 to 25% | mixed with 50 to 90% by weight of silver or gold powder.

11. The composition of claim 2 blended with an organic liquid to form a printing ink or a dotting paste.

12. The composition of claim 2 blended with an organic liquid to form a printing ink or a dotting paste.

13. The composition of claim 3 blended with an organic liquid to form a printing ink or a dotting paste.

14. The composition of claim 7 blended with an organic liquid to form a printing ink or a dotting paste.

15. The composition of claim 10 blended with an organic liquid to form a printing ink or a dotting paste.

16. An article of manufacture comprising an electronic part bonded to a metal, glass or ceramic substrate with the composition of claim 1.

17. An article of manufacture comprising an electronic part bonded to a metal, glass or ceramic substrate with the composition of claim 3.

18. An article of manufacture comprising an electronic part bonded to a metal, glass or ceramic substrate with the composition of claim 7.

19. An article of manufacture comprising an electronic part bonded to a metal, glass or ceramic substrate with the composition of claim 10.

20. An article of manufacture comprising a metal, glass or ceramic body coated with an electrically conductive pattern of the composition of claim 7.

21. An article of manufacture comprising a metal, glass or ceramic body coated with an electrically conductive pattern of the composition of claim 10.

22. A solid silver/glass preform of composition of claim 7.

23. A solid silver/glass preform of composition of claim 10.

* * * * *